US012787193B2

(12) United States Patent
Kiyota

(10) Patent No.: US 12,787,193 B2
(45) Date of Patent: Nov. 3, 2026

(54) HOUSING BOX INCLUDING RESIN INJECTION PORTION OUTSIDE OF WATER STOP REGION

(71) Applicant: YAZAKI CORPORATION, Tokyo (JP)

(72) Inventor: Hirotaka Kiyota, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 70 days.

(21) Appl. No.: 18/935,392

(22) Filed: Nov. 1, 2024

(65) Prior Publication Data

US 2025/0063678 A1 Feb. 20, 2025

Related U.S. Application Data

(63) Continuation of application No. PCT/JP2023/036470, filed on Oct. 6, 2023.

(30) Foreign Application Priority Data

Nov. 1, 2022 (JP) ................................ 2022-175501

(51) Int. Cl.
*H05K 5/00* (2025.01)
*H02G 3/08* (2006.01)
*H05K 5/06* (2006.01)

(52) U.S. Cl.
CPC ............. *H05K 5/062* (2013.01); *H02G 3/081* (2013.01); *H02G 3/088* (2013.01)

(58) Field of Classification Search
CPC ........ H05K 5/062; H02G 3/081; H02G 3/088; H02G 3/08; H02G 3/14; H02G 3/16; B29C 45/16; B29C 45/26; F16J 15/14
See application file for complete search history.

(56) References Cited

U.S. PATENT DOCUMENTS

| | | | | |
|---|---|---|---|---|
| 6,378,918 B1 | | 4/2002 | Mita et al. | |
| 9,627,796 B2 * | | 4/2017 | Tsai .................. | H01R 13/5216 |

(Continued)

FOREIGN PATENT DOCUMENTS

| | | | |
|---|---|---|---|
| JP | 2001-25135 A | 1/2001 | |
| JP | 2011-119960 A | 6/2011 | |

(Continued)

OTHER PUBLICATIONS

International Search Report for PCT/JP2023/036470 dated Dec. 19, 2023.

(Continued)

*Primary Examiner* — Rockshana D Chowdhury
(74) *Attorney, Agent, or Firm* — KENEALY VAIDYA LLP

(57) ABSTRACT

A housing box includes a main body portion having an opening portion capable of housing an object therein and communicating between an inside and an outside, a cover portion attached to the main body portion and detachably attached to the opening portion, and a resin packing member that is provided in the cover portion, disposed at least in a water stop region between the main body portion and the cover portion, and performs water stop between the main body portion and the cover portion. The packing member has a resin injection portion that is formed in a non-water stop region connected to the water stop region and deviated from the water stop region and that serves as a resin injection position during resin molding.

6 Claims, 8 Drawing Sheets

(56) References Cited

U.S. PATENT DOCUMENTS

| | | | | |
|---|---|---|---|---|
| 10,638,623 | B2 * | 4/2020 | Malecke | H05K 13/00 |
| 11,881,686 | B2 * | 1/2024 | Iida | B60R 16/0238 |
| 2006/0049585 | A1 | 3/2006 | Isono | |
| 2009/0163053 | A1 * | 6/2009 | Yamaguchi | H01R 13/5227 439/76.1 |
| 2009/0298311 | A1 * | 12/2009 | Nakanishi | H02G 3/088 439/76.1 |
| 2011/0133409 | A1 | 6/2011 | Shibuya | |
| 2014/0308833 | A1 * | 10/2014 | Fukami | B29C 70/72 439/271 |
| 2015/0145384 | A1 * | 5/2015 | Lee | B29C 45/1418 312/223.1 |
| 2015/0364855 | A1 * | 12/2015 | Ishii | H01R 13/5202 439/587 |
| 2016/0288384 | A1 * | 10/2016 | Washburn | B29C 45/26 |
| 2017/0170609 | A1 * | 6/2017 | Nakai | H01R 13/6596 |
| 2017/0257964 | A1 * | 9/2017 | Ishikawa | H05K 5/0047 |
| 2018/0045211 | A1 * | 2/2018 | Okabe | F04D 29/162 |
| 2018/0213658 | A1 * | 7/2018 | Nuriya | H01R 13/516 |
| 2019/0179375 | A1 * | 6/2019 | Huang | H05K 5/062 |
| 2019/0267754 | A1 * | 8/2019 | Ono | H01R 43/20 |
| 2019/0348797 | A1 * | 11/2019 | Shiraishi | H01R 13/6315 |
| 2019/0380220 | A1 * | 12/2019 | Matsuda | H01R 13/41 |
| 2020/0025811 | A1 * | 1/2020 | Gizelar | G01R 22/065 |
| 2020/0335901 | A1 * | 10/2020 | Yamada | H01R 9/18 |
| 2021/0100122 | A1 * | 4/2021 | Wang | G06F 1/1626 |
| 2022/0006275 | A1 * | 1/2022 | Yoshihara | H02G 3/088 |
| 2022/0159882 | A1 * | 5/2022 | Salter | B60R 16/02 |
| 2022/0217854 | A1 * | 7/2022 | Soni | H05K 5/0056 |
| 2022/0316597 | A1 * | 10/2022 | Hsiao | H05K 5/062 |
| 2025/0063678 | A1 * | 2/2025 | Kiyota | H02G 3/081 |

FOREIGN PATENT DOCUMENTS

| | | | | |
|---|---|---|---|---|
| JP | 2016200636 | A | * | 12/2016 |
| WO | 2004/018906 | A1 | | 3/2004 |

OTHER PUBLICATIONS

Japanese Office Action for the related Japanese Patent Application No. 2022-175501 dated Sep. 17, 2024.

* cited by examiner

HOUSING BOX INCLUDING RESIN INJECTION PORTION OUTSIDE OF WATER STOP REGION

CROSS-REFERENCE TO RELATED APPLICATION(S)

This application is a continuation application of International Application PCT/JP2023/036470, filed on Oct. 6, 2023 which claims the benefit of priority from Japanese Patent Application No. 2022-175501 filed on Nov. 1, 2022 and designating the U.S., the entire contents of which are incorporated herein by reference.

BACKGROUND OF THE INVENTION

1. Field of the Invention

The present invention relates to a housing box.

BACKGROUND

2. Description of the Related Art

Conventionally, as a housing box, for example, as described in Japanese Patent Application Laid-open No. 2001-25135, a housing body including a lid openable and closable with respect to a housing is known. In the housing body, a packing is disposed at a position of the lid in contact with the housing, and the packing secures a water stop function between the housing and the lid.

In the above-described housing body, there is a possibility that the water stop function inside and outside the housing body cannot be secured. For example, when the packing provided on the lid is manufactured by resin molding, a resin injection mark is formed on a part of the packing. The resin molding mark is a mark obtained by cutting a gate during the resin molding, and becomes irregularities on a surface of the packing. Therefore, when the resin injection mark is formed in the packing, a space may be formed between the packing and the housing, and the water stop function between the housing and the lid may not be sufficiently secured.

SUMMARY OF THE INVENTION

Therefore, an object of the present invention is to provide a housing box capable of securing a water stop function of a packing member.

A housing box includes according to one aspect of the present invention a main body portion having an opening portion capable of housing electronic components therein and communicating between an inside and an outside; a cover portion attached to the main body portion and detachably attached to the opening portion; and a resin packing member that is provided in the cover portion, disposed at least in a water stop region between the main body portion and the cover portion, and performs water stop between the main body portion and the cover portion, wherein the packing member has a resin injection portion that is formed in a non-water stop region connected to the water stop region and deviated from the water stop region and that serves as a resin injection position during resin molding.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments according to the present invention will be described in detail with reference to the drawings. Note that the present invention is not limited by the embodiments. In addition, constituent elements in the following embodiments include those that can be easily replaced by those skilled in the art or those that are substantially the same.

Embodiment

A housing box according to a first embodiment of the present invention will be described.

Figure 1:
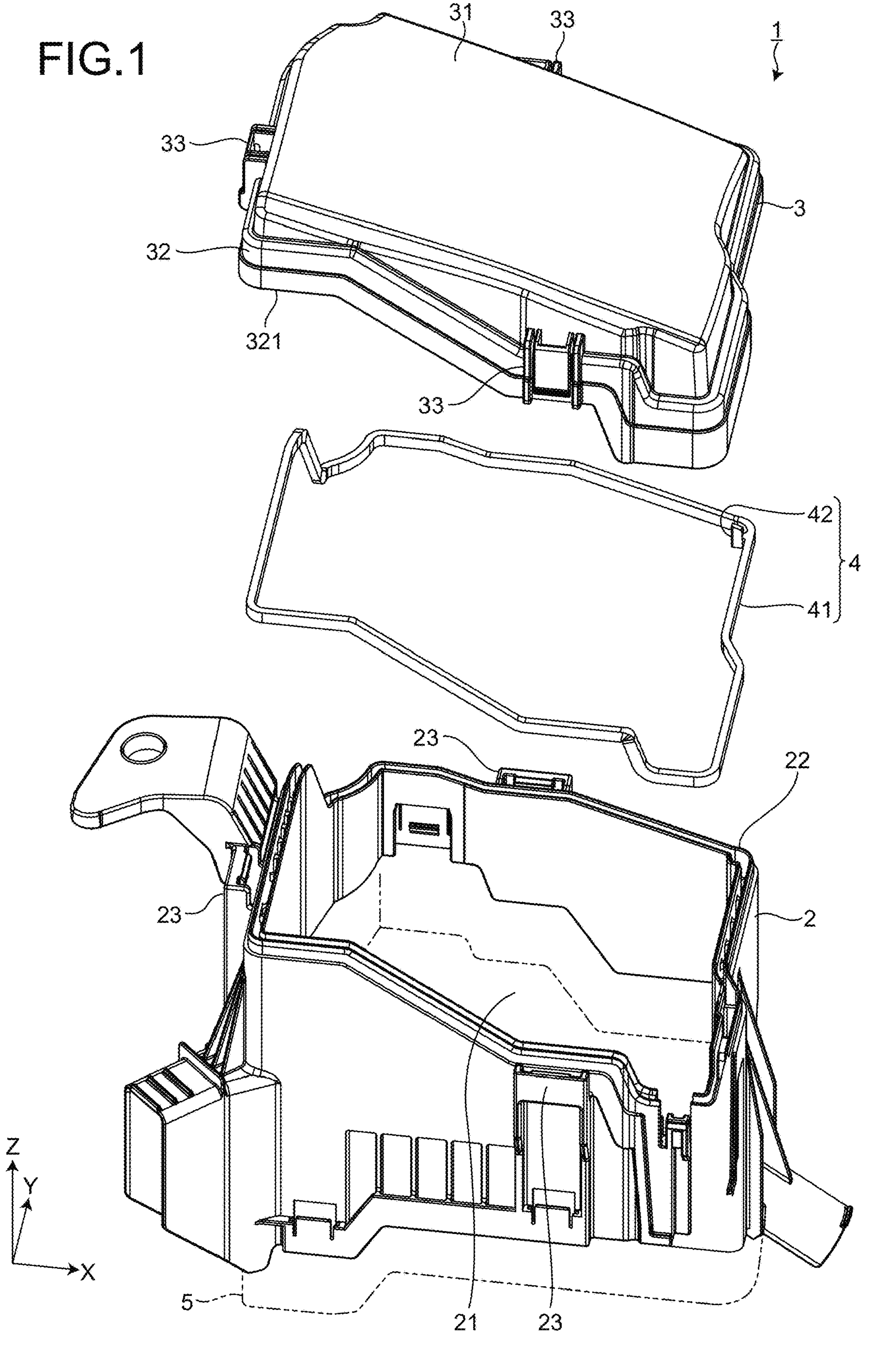
FIG. 1 is an exploded perspective view of a housing box according to a first embodiment.
Figure 2:
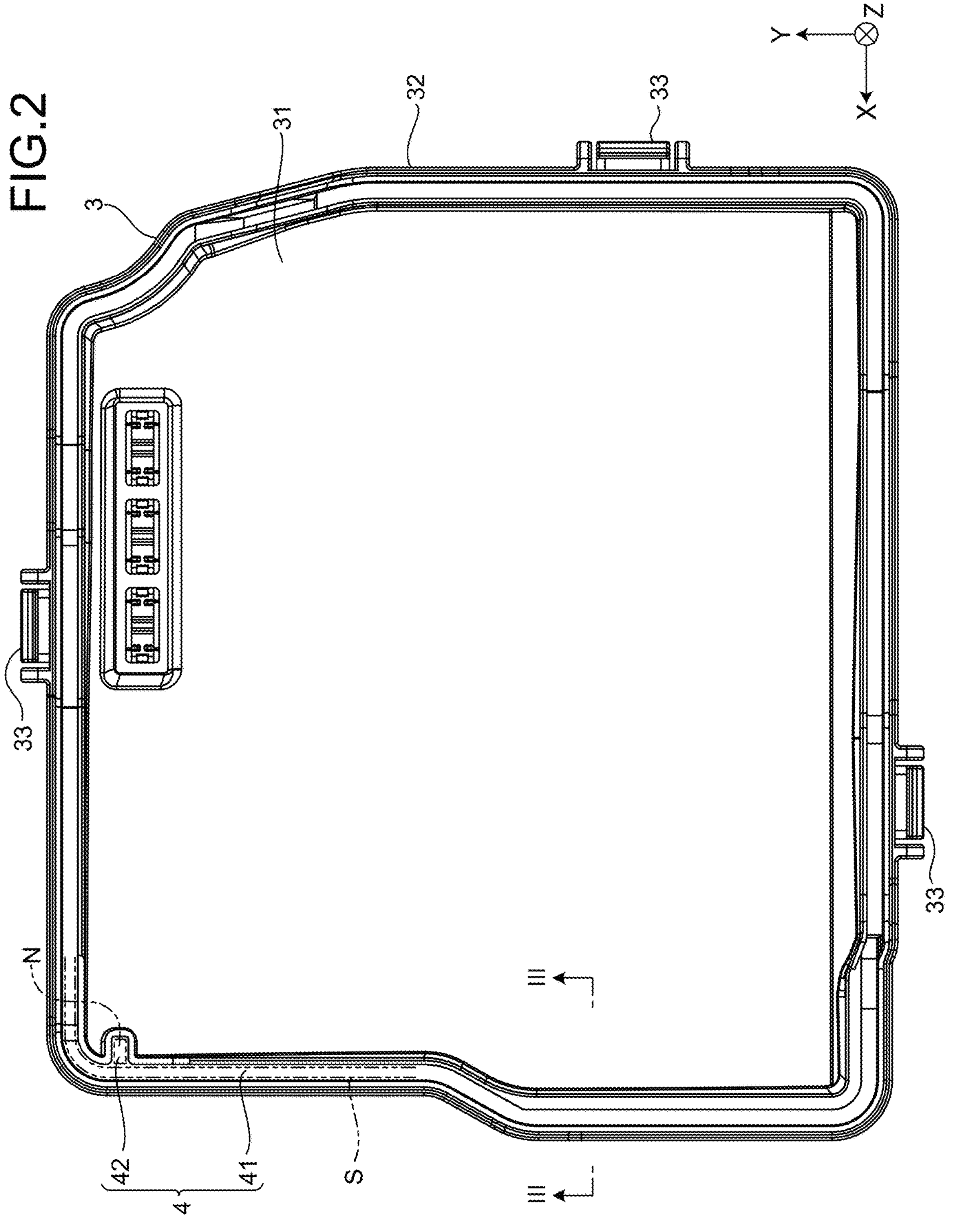
FIG. 2 is an explanatory view of a packing member of the housing box according to the first embodiment.
Figure 3:
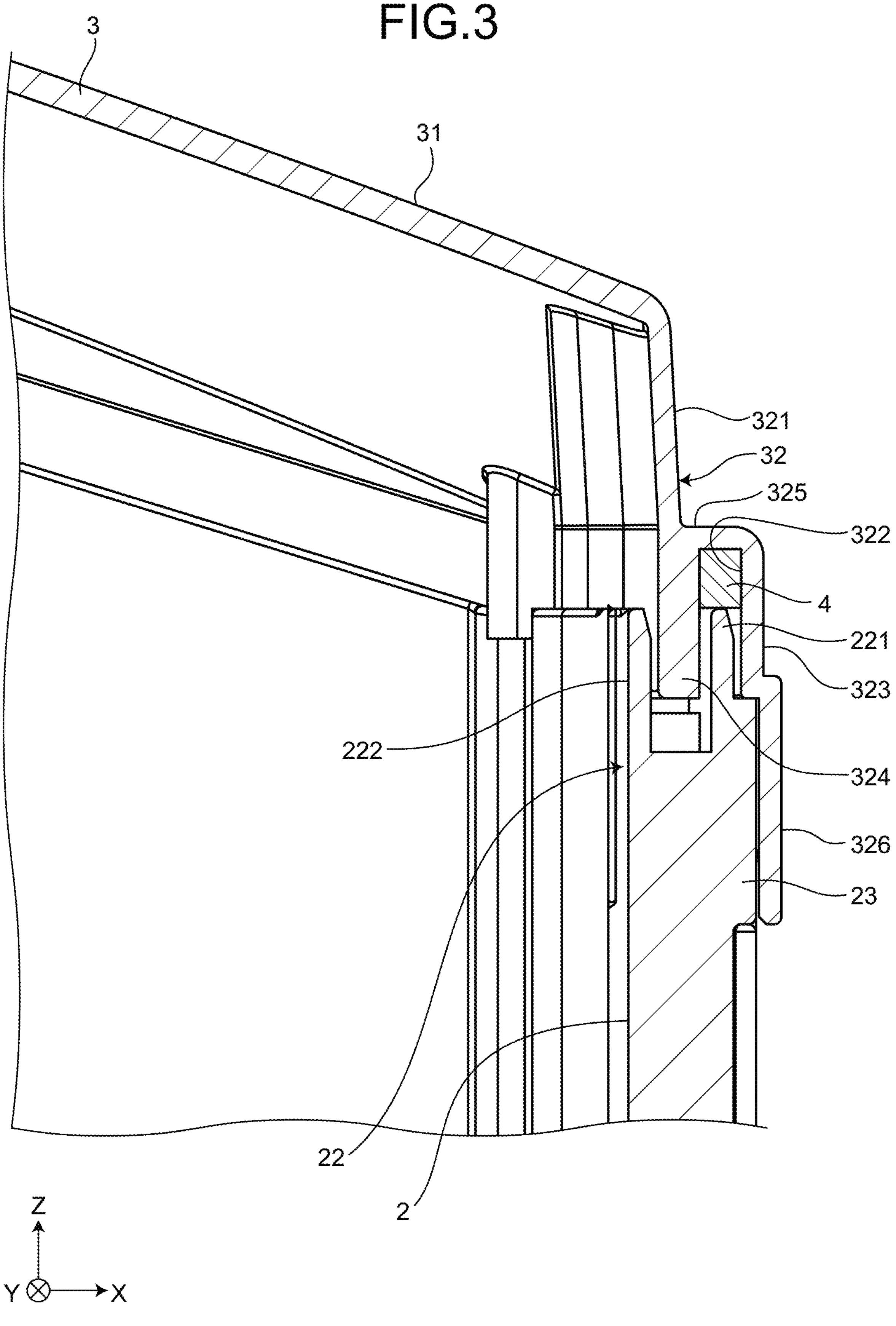
FIG. 3 is a cross-sectional view of the housing box taken along line III-III of FIG. 2.

FIG. 1 is an exploded perspective view of a housing box according to a first embodiment, FIG. 2 is an explanatory view of a packing member of the housing box according to the first embodiment, and FIG. 3 is a cross-sectional view of the housing box taken along line III-III of FIG. 2.

As illustrated in FIG. 1, a housing box 1 according to the present embodiment is a box that houses electronic components, and is used as an electrical connection box that is mounted on a vehicle and houses electronic components including a fuse and a relay, for example. The housing box 1 includes a main body portion 2, a cover portion 3, and a packing member 4. The main body portion 2 has an opening portion 21 capable of housing electronic components therein, and communicating between an inside and an outside. The main body portion 2 has, for example, a box shape in which a bottom portion and a ceiling portion are opened, and functions as a side cover. In this case, for example, the bottom portion of the main body portion 2 is closed by attaching a lower cover 5. The ceiling portion of the main body portion 2 is the opening portion 21 that communicates between the inside and the outside, and is closed by installing the cover portion 3. The opening portion 21 is, for example, an opening that opens an entire upper surface of the main body portion 2. In FIG. 1, the main body portion 2 is configured to cover an entire periphery of a side surface portion of the housing box 1, but may be configured to cover the side surface portion of the housing box 1 in combination with another component. For example, the main body portion 2 may have a shape in which a part of the side surface portion of the housing box 1 is cut out, and another component may be attached to the cutout portion to cover the side surface portion of the housing box 1.

The cover portion 3 is an upper cover that covers the opening portion 21 of the main body portion 2, is attached to the main body portion 2 to cover the opening portion 21, and is detachably attached to the opening portion 21. The cover portion 3 has a top surface portion 31 and a lower wall portion 32. The top surface portion 31 is an upper surface portion of the cover portion 3, and has a shape corresponding to the shape of the main body portion 2 as viewed from above, for example, a rectangular shape or a substantially rectangular shape. The lower wall portion 32 is a wall portion extending downward from an outer edge of the top surface portion 31, and is formed over an entire outer edge of the top surface portion 31. A downward extension length of the lower wall portion 32 is set according to a shape of an upper edge portion 22 of the main body portion 2. That is, the upper edge portion 22 of the main body portion 2 fluctuates up and down along an outer edge according to conditions such as an installation space and an outer shape of the housing box 1. The downward extension length of the lower wall portion 32 is set so that the lower wall portion 32 can be joined to the upper edge portion 22 over the entire periphery. The cover portion 3 is provided with an engagement portion 33. The engagement portion 33 is a portion that engages with an engaged portion 23 of the main body portion 2 to hold and release the cover portion 3 with respect to the main body portion 2. For example, a plurality of engagement portions 33 are formed on an outer surface of the lower wall portion 32.

The packing member 4 is a water stop member that performs water stop between the main body portion 2 and the cover portion 3, and is formed of a resin. The packing member 4 is formed of a resin having lower rigidity than the cover portion 3, and is formed of, for example, an elastic resin such as an elastomer. The packing member 4 has a main body 41 and a resin injection portion 42. The main body 41 is a portion that functions as the water stop member, is disposed in a water stop region S between the main body portion 2 and the cover portion 3, and is formed in an annular shape. The water stop region S is a region between the main body portion 2 and the cover portion 3, and is a region that abuts on the main body portion 2 on one side and abuts on the cover portion 3 on the other side. The resin injection portion 42 is a portion that serves as a resin injection position during resin molding of the packing member 4, and is formed in a non-water stop region N connected to the main body 41 and deviated from the water stop region S. For example, as illustrated in FIG. 2, the main body 41 is disposed along the water stop region S at an outer edge of the cover portion 3. The resin injection portion 42 is formed to branch and protrude from the main body 41. For example, the resin injection portion 42 is formed to extend from the water stop region S where the main body 41 is disposed to an inside of the cover portion 3. That is, the resin injection portion 42 is formed so as to branch from the main body 41 and extend toward a center side of the cover portion 3, and is formed in the non-water stop region N that is not sandwiched between the main body portion 2 and the cover portion 3. Therefore, even when the resin injection portion 42 has a gate mark and a surface of the resin injection portion 42 has irregularities, water stop performance by the packing member 4 is not affected. Therefore, the water stop performance of the packing member 4 can be reliably secured. Note that FIG. 2 is a view as viewed from a back side (lower side) of the cover portion 3, and illustration of the main body portion 2 is omitted.

As illustrated in FIG. 3, the packing member 4 is provided in a groove 322 formed in the cover portion 3. The groove 322 is formed between an outer wall 323 and an inner wall 324 provided below a hanging portion 321. The hanging portion 321 is a part of the lower wall portion 32 and is a wall portion extending downward from the top surface portion 31. The inner wall 324 is a wall portion that is continuous to a lower portion of the hanging portion 321. The outer wall 323 is a wall portion that is continuous to the lower portion of the hanging portion 321 via a protruding portion 325, and is located outside the inner wall 324 and provided at a predetermined distance from the inner wall 324. The protruding portion 325 is provided so as to protrude outward from a lower end of the hanging portion 321, and a distal end thereof is continuous with the outer wall 323. An extension portion 326 is continuously formed below the outer wall 323. The extension portion 326 is a wall portion that covers an outside of a side wall 24 of the main body portion 2. The groove 322 is formed so as to be surrounded by the inner wall 324, the protruding portion 325, and the outer wall 323, and is a space opened downward. The groove 322 is formed along an extending direction (in FIG. 3, a Y direction) of a lower edge of the lower wall portion 32. The packing member 4 is disposed, for example, at a deep position in an upper portion of the groove 322 and is disposed so as to be in contact with the protruding portion 325. When the cover portion 3 is attached to the main body portion 2, the upper edge portion 22 of the main body portion 2 is inserted into the groove 322. For example, in the upper edge portion 22, two protruding pieces 221 and 222 protruding upward from an upper end are formed, and one protruding piece 221 is inserted into the groove 322. The protruding pieces 221 and 222 are ridges formed along the extending direction (in FIG. 3, the Y direction) of the upper edge portion 22, are formed in parallel with the inside and the outside, and are provided so as to be positioned outside and inside the inner wall 324.

Next, a method for manufacturing the housing box according to the first embodiment will be described.

Figure 4:
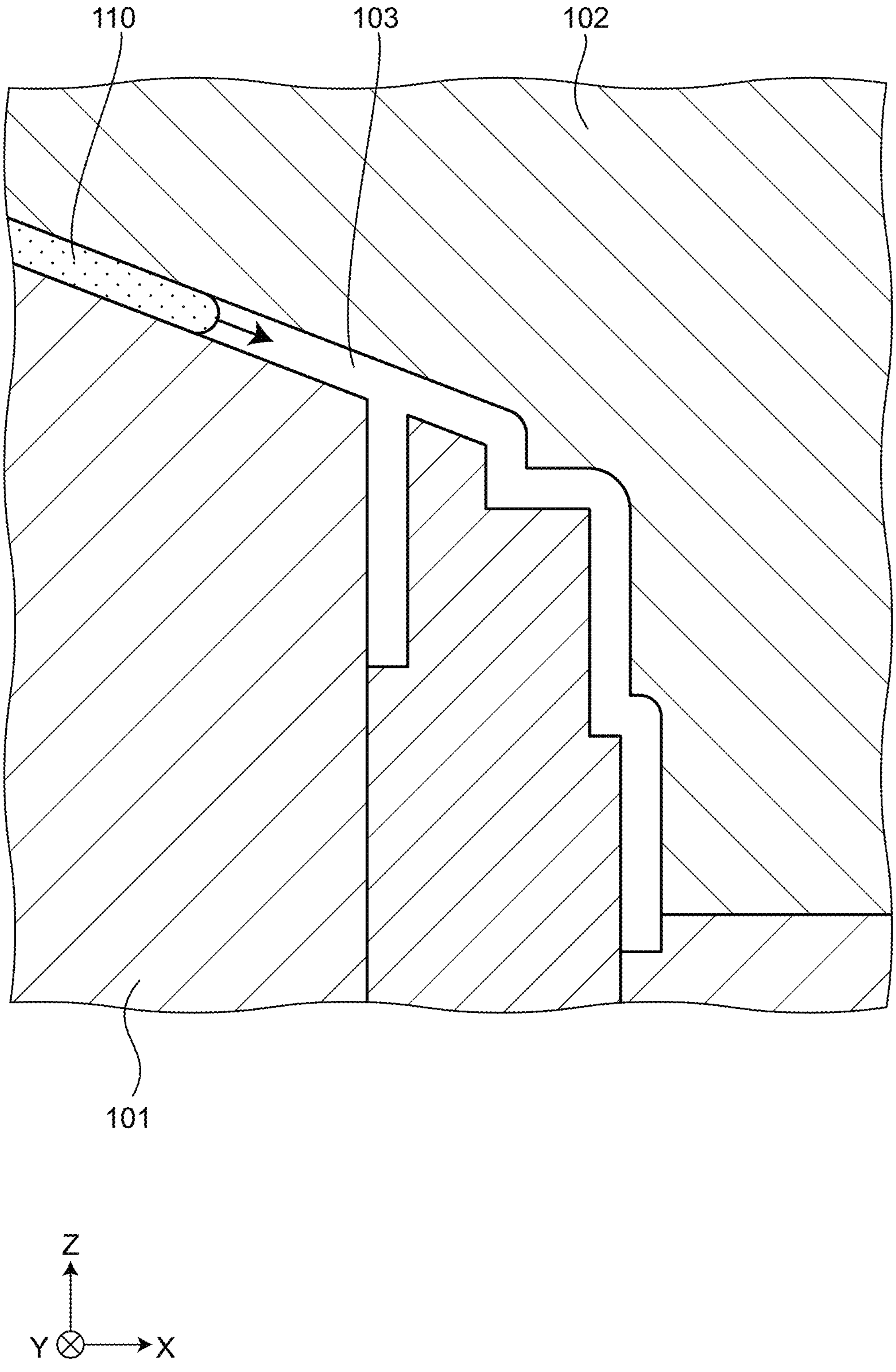
FIG. 4 is an explanatory view of a method for manufacturing the housing box according to the first embodiment.
Figure 5:
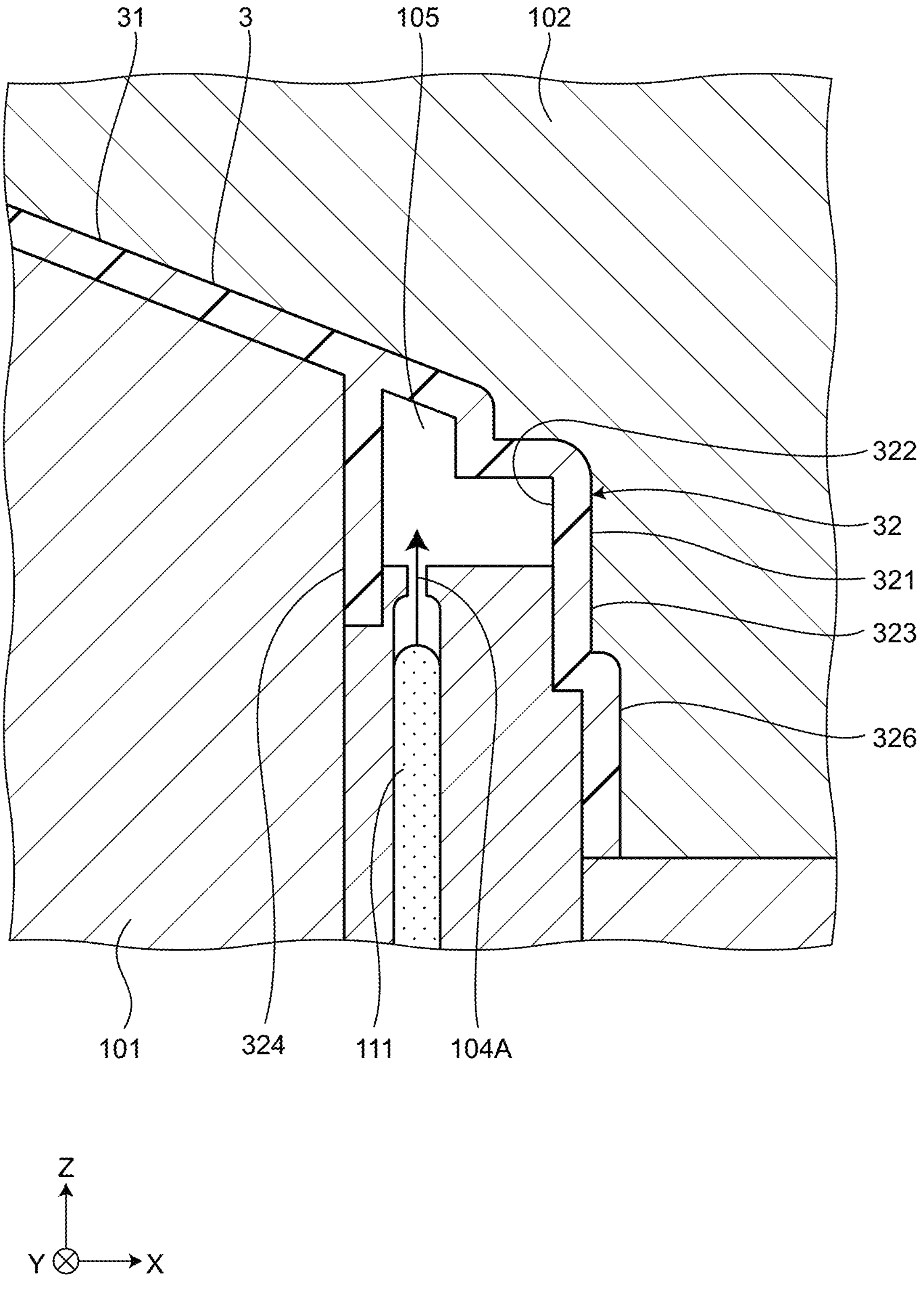
FIG. 5 is an explanatory view of the method for manufacturing the housing box according to the first embodiment.
Figure 6:
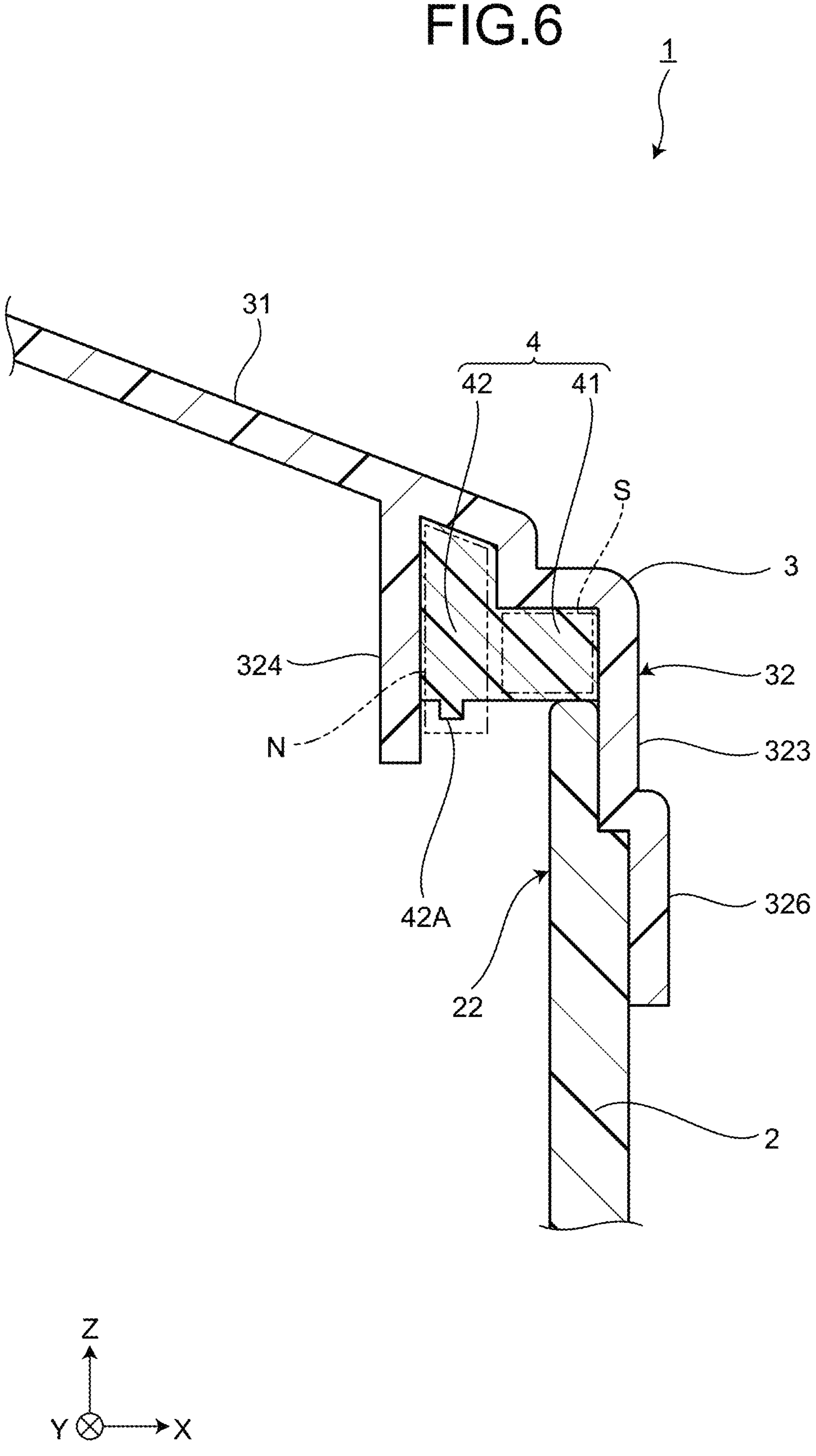
FIG. 6 is an explanatory view of the method for manufacturing the housing box according to the first embodiment.

FIGS. 4, 5, and 6 are explanatory views of the method for manufacturing the housing box according to the first embodiment, and are explanatory views of resin molding of the cover portion and the packing member.

The housing box 1 is manufactured by attaching the cover portion 3 provided with the packing member 4 to the main body portion 2. The main body portion 2, the cover portion 3, and the packing member 4 are manufactured individually. The main body portion 2 is manufactured by resin molding, for example. When the main body portion 2 is not made of a resin, the main body portion 2 may be manufactured by a method other than resin molding.

The cover portion 3 and the packing member 4 are manufactured by resin molding. For example, the cover portion 3 and the packing member 4 are manufactured by two-color molding using two different types of resins. Specifically, first, as illustrated in FIG. 4, a first resin 110 for molding having fluidity at a high temperature is injected into a molding space 103 formed between molds 101 and 102. The molding space 103 is formed to correspond to a shape of the cover portion 3. Then, the first resin 110 is filled in the molding space 103 and is cured by being cooled to become the cover portion 3.

Then, as illustrated in FIG. 5, a second resin 111 for molding having fluidity at a high temperature is injected into a molding space 105 formed between the mold 101 and the cover portion 3. The molding space 105 is formed to correspond to a shape of the packing member 4. At this time, the second resin 111 is injected into the molding space 105 from a position to be the resin injection portion 42. That is, a gate 104A of a mold 104 is provided at a position to be the resin injection portion 42. The second resin 111 is a resin different from the first resin 110, and is a resin having lower rigidity than the first resin 110 when cured. Then, the second resin 111 is injected into the molding space 105 through the gate 104A and is filled in the molding space 105. Then, the second resin 111 is cured by being cooled, and the second resin 111 becomes the packing member 4.

As illustrated in FIG. 6, the cover portion 3 and the packing member 4 are manufactured by two-color molding. At this time, a gate mark 42A is formed on the surface of the resin injection portion 42 of the packing member 4. The gate mark 42A is a protrusion or a recess formed by cutting the resin of the gate 104A, and may be a burr, a depression, a gap, or a space. However, since the resin injection portion 42 is at a position deviated from the water stop region S between the main body portion 2 and the cover portion 3, even when the gate mark 42A is formed in the resin injection portion 42, the water stop performance of the packing member 4 is not affected. Therefore, high water stop performance by the packing member 4 is secured, and the water stop performance by the packing member 4 can be improved.

As described above, according to the housing box 1 of the present embodiment, the packing member 4 that performs water stop between the main body portion 2 and the cover portion 3 has the resin injection portion 42 in the non-water stop region N deviated from the water stop region S. Therefore, the resin injection portion 42 is not formed in the water stop region S, and irregularities due to resin injection do not occur on a surface of the water stop region S. Therefore, the housing box 1 can reliably secure the water stop function by the packing member 4.

In the housing box 1 according to the present embodiment, the resin injection portion 42 is formed to extend from the water stop region S to the inside of the cover portion 3. Therefore, irregularities due to resin injection do not occur on the surface of the water stop region S. Therefore, the housing box 1 can reliably secure the water stop function by the packing member 4.

Next, a housing box according to a second embodiment will be described.

Figure 7:
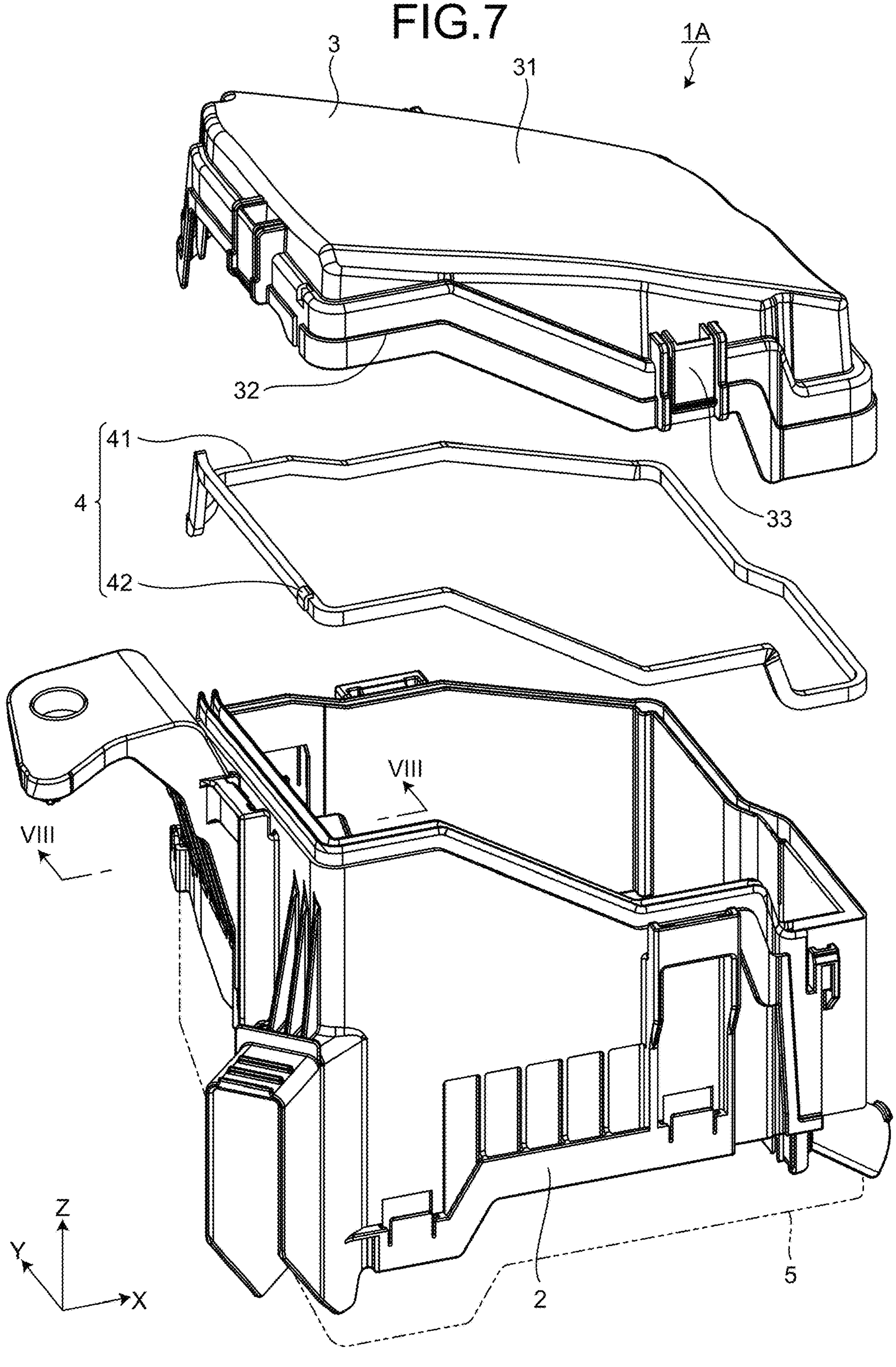
FIG. 7 is an exploded perspective view of a housing box according to a second embodiment.
Figure 8:
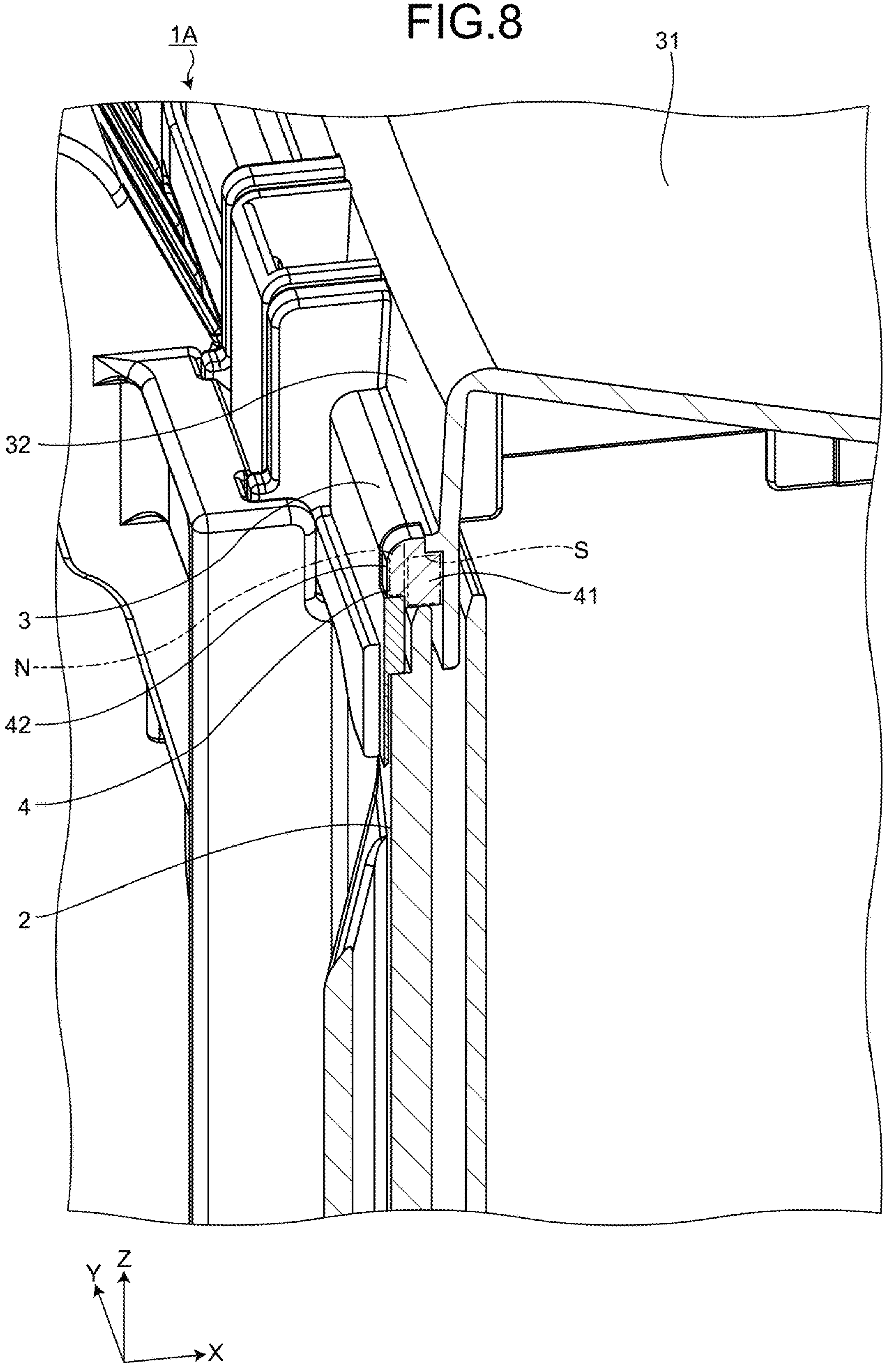
FIG. 8 is a cross-sectional view of the housing box taken along line VIII-VIII in FIG. 7.

FIG. 7 is an exploded perspective view of the housing box according to the second embodiment, and FIG. 8 is a cross-sectional view of the housing box taken along line VIII-VIII in FIG. 7.

A housing box 1A according to the second embodiment is configured substantially similarly to the housing box 1 according to the first embodiment, and is different in the configuration of the resin injection portion 42 of the packing member 4. That is, they are different in that, in the packing member 4 of the housing box 1 according to the first embodiment, the resin injection portion 42 extends from the water stop region S to the inside of the cover portion 3, but in the packing member 4 of the housing box 1A according to the second embodiment, the resin injection portion 42 extends from the water stop region S to an outside of the cover portion 3.

As illustrated in FIG. 8, the resin injection portion 42 is formed so as to extend from the water stop region S where the main body 41 is disposed to the outside of the cover portion 3. That is, the resin injection portion 42 is formed so as to branch from the main body 41 and extend to the outside of the cover portion 3, and is formed so as to penetrate the cover portion 3 and be exposed to an external surface of the cover portion 3. By forming the resin injection portion 42 in this manner, the resin injection portion 42 is formed in the non-water stop region N that is not sandwiched between the main body portion 2 and the cover portion 3. Therefore, even when the resin injection portion 42 has a gate mark and the surface of the resin injection portion 42 has irregularities, water stop performance by the packing member 4 is not affected. Therefore, the housing box 1A can reliably secure the water stop performance of the packing member 4.

The cover portion 3 and the packing member 4 of the housing box 1A are manufactured by, for example, two-color molding similarly to the housing box 1 according to the first embodiment. In this case, in the molding of the packing member 4, the second resin 111 is injected from the position exposed to the external surface of the cover portion 3. Therefore, even when the irregularities of the gate mark is formed on the surface of the resin injection portion 42, it is not the water stop region S between the main body portion 2 and the cover portion 3, so that the water stop function of the packing member 4 is not affected.

As described above, in the housing box 1A according to the present embodiment, the resin injection portion 42 is formed to extend from the water stop region S to the outside of the cover portion 3. Therefore, irregularities due to resin injection do not occur on the surface of the water stop region S. Therefore, the housing box 1A can reliably secure the water stop function by the packing member 4. In addition, in the housing box 1A, since the resin injection portion 42 penetrates the inside and the outside of the cover portion 3, the packing member 4 can be hardly deviated from the water stop region S. Therefore, the housing box 1A can reliably secure the water stop function by the packing member 4.

Note that the housing box according to each embodiment of the present invention described above is not limited to the above-described embodiments, and various modifications can be made within the scope described in the claims. In addition, the housing box according to the present embodiment may be configured by appropriately combining the components of the embodiment and the modifications described above.

For example, in the above-described embodiments, a case where the housing box is applied to an electrical connection box that is mounted on a vehicle and houses electronic components has been described, but the housing box according to the present invention may be applied to a housing box other than the electrical connection box.

Further, in the above-described embodiments, the housing box in which the cover portion 3 is attached to the upper cover has been described, but it may be configured as a housing box in which the cover portion 3 is attached to the lower cover. In addition, it may be configured as the housing box to which the cover portion 3 is attached as the upper cover and the lower cover.

According to a housing box of the present embodiment, it is possible to secure a water stop function of a packing member.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A housing box comprising:

a main body having an opening capable of housing electronic components therein and communicating between an inside and an outside;

a cover attached to the main body and detachably attached to the main body at the opening; and a resin packing member that is provided in the cover, disposed at least in a water stop region between the main body and the cover, and performs water stop between the main body and the cover, wherein the cover has a top surface that covers the opening and a lower wall that extends downward from an outer edge of the top surface, a groove is formed in a lower portion of the lower wall, and the resin packing member is provided in the groove and has a resin injection portion that is formed in a non-water stop region deviated from the water stop region and that serves as a resin injection position during resin molding.

2. The housing box according to claim 1, wherein the resin injection portion is formed to extend from the water stop region to an inside of the cover.

3. The housing box according to claim 1, wherein the resin injection portion extends from the water stop region to an outside of the cover and is formed so as to penetrate the cover and to be exposed to an external surface of the cover.

4. The housing box according to claim 1, wherein the cover includes an inner wall and an outer wall that surrounds the inner wall, and the groove is bound by the inner wall and the outer wall.

5. The housing box according to claim 4, wherein the main body includes an upper edge portion that extends into the groove, the upper edge is located between the inner wall and the outer wall and abuts the packing member.

6. The housing box according to claim 1, wherein the cover includes:

a hanging portion that is connected to and extends from the top surface along a first direction, a protruding portion that is connected to and extends from the hanging portion along a second direction that intersects the first direction, an inner wall that is connected to and extends from the protruding portion along the first direction, an outer wall that is connected to and extends from the protruding portion along the first direction, the outer wall is spaced away from and surrounds the inner wall, and an extension portion that is connected to and extends from the outer wall along the first direction, the groove is bounded by the inner wall, the protruding portion and the outer wall, the main body includes a side wall that surrounds the opening, the side wall extends into the groove, and the extension portion extends along an outside of the side wall.

* * * * *